(12) United States Patent
Givant et al.

(10) Patent No.: US 11,935,603 B2
(45) Date of Patent: Mar. 19, 2024

(54) ERASE POWER LOSS INDICATOR (EPLI) IMPLEMENTATION IN FLASH MEMORY DEVICE

(71) Applicant: Infineon Technologies LLC, San Jose, CA (US)

(72) Inventors: Amichai Givant, Rosh Ha'Ayin (IL); Idan Koren, Kiryat Ono (IL); Shivananda Shetty, San Jose, CA (US); Pawan Singh, San Jose, CA (US); Yoram Betser, Mazkeret Batya (IL); Kobi Danon, Te-Aviv (IL); Amir Rochman, Tel-aviv (IL)

(73) Assignee: Infineon Technologies LLC, San Jose, CA (US)

( * ) Notice: Subject to any disclaimer, the term of this patent is extended or adjusted under 35 U.S.C. 154(b) by 93 days.

(21) Appl. No.: 17/572,881

(22) Filed: Jan. 11, 2022

(65) Prior Publication Data

US 2023/0137469 A1    May 4, 2023

Related U.S. Application Data

(60) Provisional application No. 63/275,779, filed on Nov. 4, 2021.

(51) Int. Cl.
*G11C 16/34* (2006.01)
*G11C 16/04* (2006.01)
(Continued)

(52) U.S. Cl.
CPC ........ *G11C 16/344* (2013.01); *G11C 16/0425* (2013.01); *G11C 16/0466* (2013.01);
(Continued)

(58) Field of Classification Search
CPC .............. G11C 16/344; G11C 16/0425; G11C 16/0466; G11C 16/08; G11C 16/14;
(Continued)

(56) References Cited

U.S. PATENT DOCUMENTS

| 5,677,867 A * | 10/1997 | Hazani .................. G11C 16/08 257/E27.103 |
| 6,580,643 B1 * | 6/2003 | Satoh ................. G11C 16/3481 365/185.29 |

(Continued)

FOREIGN PATENT DOCUMENTS

| CN | 112700808 A * | 4/2021 | ......... G11C 11/4074 |
| EP | 3176790 A2 * | 6/2017 | ............. G11C 16/10 |

OTHER PUBLICATIONS

PCT Search Report and Written Opinion from Application PCT/US22/48786 dated Feb. 22, 2023; 11pages.

*Primary Examiner* — Michael T Tran

(57) ABSTRACT

A non-volatile memory has an array of non-volatile memory cells, first reference word lines and second reference word lines, and sense amplifiers. The sense amplifiers read system data, that has been written to supplemental non-volatile memory cells of the first reference word lines, using comparison of the supplemental non-volatile memory cells of the first reference word lines to supplemental non-volatile memory cells of the second reference word lines. Status of erasure of the non-volatile memory cells of the array is determined based on reading the system data.

20 Claims, 11 Drawing Sheets

(51) Int. Cl.
*G11C 16/08* (2006.01)
*G11C 16/14* (2006.01)
*G11C 16/26* (2006.01)

(52) U.S. Cl.
CPC .............. *G11C 16/08* (2013.01); *G11C 16/14* (2013.01); *G11C 16/26* (2013.01); *G11C 16/3459* (2013.01)

(58) Field of Classification Search
CPC ................ G11C 16/26; G11C 16/3459; G11C 2211/5646; G11C 16/16; G11C 16/28; G11C 16/3445
USPC .............................................. 365/205, 230.03
See application file for complete search history.

(56) References Cited

U.S. PATENT DOCUMENTS

| | | | |
|---|---|---|---|
| 6,711,062 B1* | 3/2004 | Chou .................... | G11C 16/28 365/185.29 |
| 7,545,679 B1* | 6/2009 | Eguchi .................. | G11C 29/50 365/185.09 |
| 9,330,783 B1* | 5/2016 | Rotbard ............... | G11C 29/025 |
| 10,438,673 B1* | 10/2019 | Chen ..................... | G11C 16/26 |
| 10,861,550 B1* | 12/2020 | Daryanani ......... | G11C 16/0408 |
| 2006/0034128 A1 | 2/2006 | Han et al. | |
| 2006/0256622 A1* | 11/2006 | Aritome ............... | G11C 16/344 365/185.29 |
| 2008/0106941 A1 | 5/2008 | Cho | |
| 2008/0205158 A1* | 8/2008 | Pagano ................. | G11C 7/062 365/185.21 |
| 2010/0059808 A1* | 3/2010 | Zheng .................. | H01L 29/513 257/E21.294 |
| 2012/0176844 A1* | 7/2012 | Cunningham ...... | G11C 11/5642 365/185.2 |
| 2014/0003155 A1* | 1/2014 | Hong ..................... | G11C 16/10 365/185.18 |
| 2015/0003162 A1* | 1/2015 | Mui .................... | G11C 16/3459 365/185.17 |
| 2017/0337971 A1* | 11/2017 | Tran ...................... | G11C 16/14 |
| 2017/0365300 A1 | 12/2017 | Danon et al. | |
| 2018/0122489 A1* | 5/2018 | Ray ........................ | G11C 16/28 |
| 2018/0130535 A1* | 5/2018 | Lee ...................... | G11C 16/3445 |
| 2019/0138414 A1* | 5/2019 | Shim .................... | G06F 11/2094 |
| 2019/0286976 A1* | 9/2019 | Tran ....................... | G06N 3/045 |
| 2020/0027888 A1* | 1/2020 | Chern ................... | H10B 41/10 |
| 2020/0202941 A1* | 6/2020 | Lai ........................ | G11C 16/26 |
| 2020/0294593 A1* | 9/2020 | Sun ....................... | G11C 16/26 |
| 2021/0019608 A1* | 1/2021 | Tran ...................... | G11C 16/10 |
| 2021/0057030 A1* | 2/2021 | Lee ....................... | G11C 11/419 |
| 2021/0118485 A1* | 4/2021 | Lim ...................... | G11C 13/0004 |
| 2021/0209457 A1* | 7/2021 | Tran ...................... | G06F 17/16 |
| 2021/0223983 A1 | 7/2021 | Yogev et al. | |
| 2021/0350217 A1* | 11/2021 | Tran ..................... | G11C 16/0416 |
| 2021/0391012 A1* | 12/2021 | Masuduzzaman ............................ | G11C 16/3427 |
| 2021/0391019 A1* | 12/2021 | Shin ....................... | G06F 3/0679 |

\* cited by examiner

Program (Left) by CHEI and Erase (Right) by BTBT Hot Hole Injection

ERASE POWER LOSS INDICATOR (EPLI) IMPLEMENTATION IN FLASH MEMORY DEVICE

CROSS-REFERENCE TO RELATED APPLICATIONS

This application claims benefit of priority from U.S. Provisional Application No. 63/275,779 filed Nov. 4, 2021, which is hereby incorporated by reference.

TECHNICAL FIELD

The present disclosure relates generally to non-volatile memory (NVM) devices, and more particularly to NVM devices or systems that implement erase power loss indicator (EPLI) embodiments to improve erase operation reliability and performance, and methods of operation thereof.

BACKGROUND

Flash memory is both a mature and still-developing technology, with NAND flash and NOR flash each having advantages and disadvantages as standalone memory and embedded memory in memory devices and systems. Generally, flash memory is implemented in the physical form of a flash memory array, as an array of non-volatile memory cells that are writable with a specified amount of data, and erasable in larger amounts (e.g., erase blocks, erase regions, sectors or erase sectors). One known problem is that an erase process may be disrupted with a power loss, leaving non-volatile memory cells in an erase region in non-uniform, unreliable state that can catastrophically disrupt subsequent usage of the memory, and any system relying on same. One known solution to this problem, applicable to some non-volatile memory devices, is to use an erase power loss indicator (EPLI) written (i.e., programmed) to specified bits in a sector, as described in U.S. Pat. No. 9,378,829, hereby incorporated by reference. Yet, this solution may not be applicable to all types of flash memory or all memory devices and systems. Therefore, there is a need in the art for a solution which overcomes the drawbacks described above.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
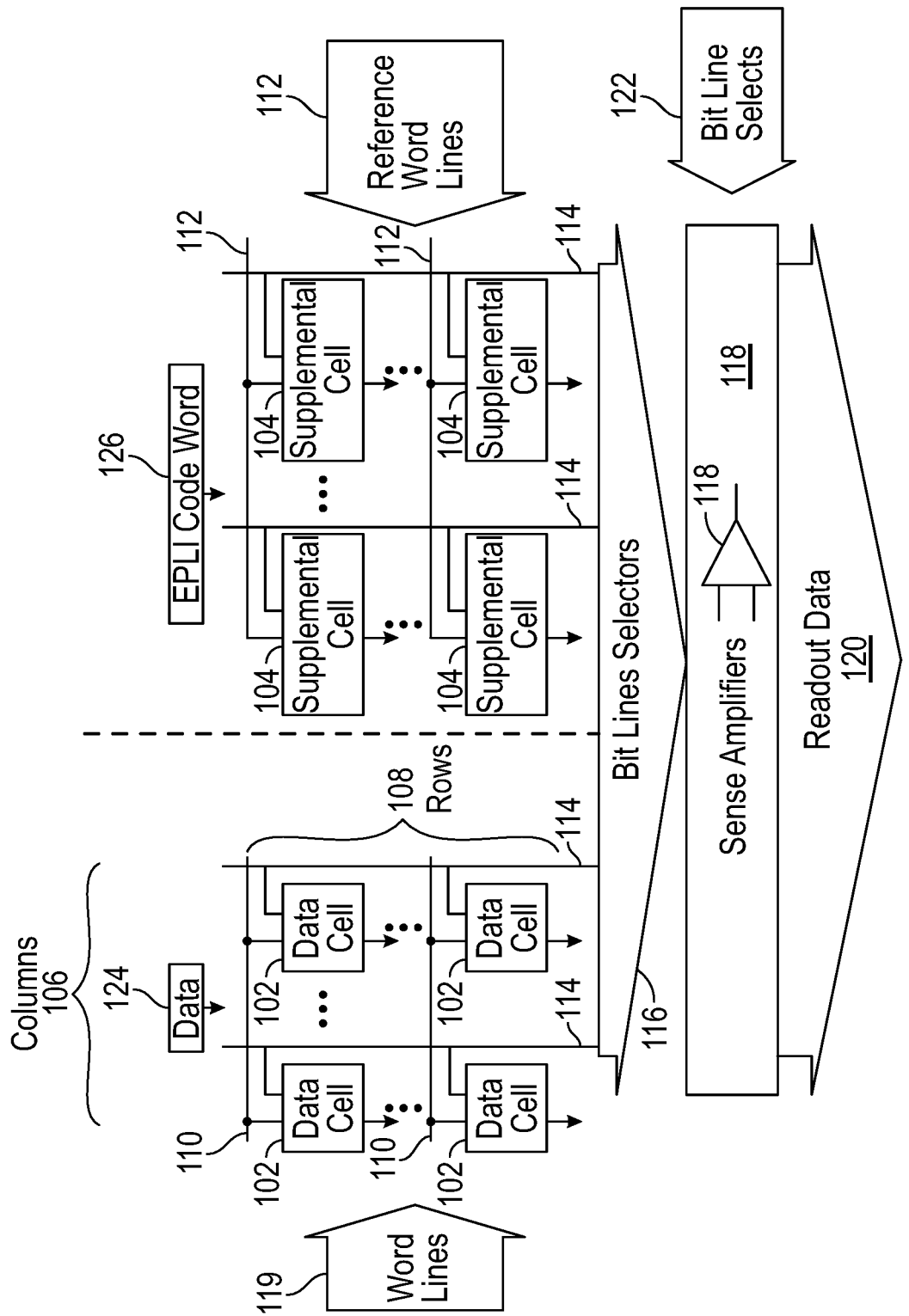
FIG. 1 depicts a NOR flash memory, with data written to selected data cells and an erase power loss indicator (EPLI) code word written to selected supplemental cells, in accordance with an embodiment.

In the following description, for purposes of explanation, numerous specific details are set forth in order to provide a thorough understanding of the present embodiments. It will be evident, however, to one skilled in the art that the present embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

Various embodiments described herein write and read data in a NOR flash memory array (e.g., as would a typical NOR flash memory), and write and read an erase power loss indicator (EPLI) or other system data (more generally, other data) to various reference word lines, more specifically to supplemental cells of various reference word lines. In some embodiments, as in other NOR flash memory embodiments, supplemental cells (or more specifically, supplemental non-volatile memory cells) are primarily used in reading out data in the non-volatile memory cells of the NOR flash memory array, and such is the case in present embodiments. In other words, supplemental cells connected by reference word lines would not typically store data, and these supplemental cells are distinct from the memory cells of the array that are typically used to store data. Present embodiments thus make use of reference word lines, and more specifically supplemental cells of reference word lines, to present a practical application and solution to the technological problem of how (and where) to store an erase power loss indicator or other system data without consuming space in the NOR flash memory array (and thereby decreasing available storage space for data), and without adding further area penalty. Further, present embodiments present a practical solution to the technological problem of how to reliably verify an erase power loss indicator or other system data that is stored in an unusual location outside of the NOR flash memory cell array itself but within the NOR flash memory or NOR flash memory device, and which may not otherwise benefit from usual read reliability technology.

Previous technological solutions to the technological problem of erasure process disruption through power loss have included writing and reading an erase power loss indicator in the same erase region of a non-volatile memory that is subjected to the erasure process. In such embodiments, the Erase Power Loss Indicator (EPLI) is a non-volatile memory (NVM) code located within a cycling erase sector (E-sector) used to indicate if the last erase command done on that E-sector was completed successfully and indicate that the data (more specifically, the erasure state of the cells) in that E-sector may therefore be trusted. One of the important usages of EPLI, is that it enables a blank-check feature that is used as part of the erase flow in such embodiments. Present embodiments disclose, among further aspects, how to implement the EPLI concept in embedded charge trapping (eCT™) products, and, more broadly, how to implement the EPLI concept or other specialized storage of system data in NOR flash memory that has reference word lines.

To provide a solution to the technological problem of how to implement the EPLI concept or other specialized storage of system data without decreasing storage space or incurring area penalty, one approach is to write the EPLI or other system data to supplemental non-volatile memory cells, so that storage space is not consumed in the non-volatile memory cell array, and extra non-volatile memory cells do not need to be added. In one embodiment, in order to implement the EPLI code in a NOR flash memory architecture that has embedded charge trapping non-volatile memory cells, without area penalty, one available place is to locate such code in the Dynamic-Reference (DREF) wordline (WL), more specifically in available supplemental non-volatile memory cells in the Dynamic Reference Word Line(s). However, this introduces another technological problem. One problem in such implementation is that EPLI code that is written in the supplemental cells of the Dynamic-Reference Word Line(s) can be read by comparing with reference cells of the Static Reference Word Lines resulting in an EPLI code that would be significantly less reliable than the regular data reliability (e.g., one in which non-volatile memory cells of the NVM cell array are compared to a hybrid reference that is composed of supplemental cells of both the dynamic reference word lines and the static reference word lines).

The present embodiments disclose a unique EPLI code implementation approach in which the EPLI code is located in a DREF WL, as a first technological solution, and also disclose a unique EPLI coding and EPLI code word reading and verification implementation approach which assures reliability that is better than regular data reliability. With such implementation, there is no area penalty as well as no reliability penalty to EPLI code.

The present embodiments are a unique approach that implements reliable EPLI code per erase-sector in embedded charge trapping NOR flash memory and further NOR flash memory architectures without any extra area cost.

In various embodiments, EPLI code is written into available memory cells that cannot be sensed with hybrid referencing (and therefore not used for data storage). In order to then restore the reliability of that code, a unique data multiplication and majority read approach is applied in some embodiments, resulting in code reliability that exceeds regular data reliability. In further embodiments, these technological solutions are envisioned in various combinations for other flash memories that have dynamic reference word lines and static reference word lines, which could include NOR flash memory embodiments and NAND flash memory embodiments that do not necessarily have split-gate or eCT™ cells.

Various types of system data can be stored, using this approach. Moreover, this approach is also used to implement a reliable program/erase cycling counter per erase sector and storage for other system data, such as timestamp, firmware revision identifier, codes, counters, pointers to addresses, calculation results, information about chip performance, information about chip reliability, etc., also without area penalty. System data is not limited to EPLI or a cycling counter, in various further embodiments.

FIG. 1 depicts a NOR flash memory, with data 124 written to selected data cells 102 and an erase power loss indicator (EPLI) code word 126 written to selected supplemental cells 104, in accordance with an embodiment. Data cells 102 are arranged in an array of columns 106 and rows 108, connected in NOR arrangement to bit lines 114, and selectably addressed through word lines 110 and bit line selects 122 as in a conventional NOR flash memory. Supplemental cells 104 are arranged separately from the array of data cells 102, and are selectably addressed (e.g., according to a memory address) through reference word lines 112 and bit line selects 122. Bit lines selectors 116, e.g., switches or more specifically transistors, couple selected bit lines 114 to the sense amplifiers 118 according to the bit line selects 122, and the sense amplifiers 118 generate readout data 120. Voltage sources, switching circuits, selection logic, writing and erasure circuitry and further support circuits are readily developed for specific implementations, again as in a conventional NOR flash memory or as suitable for specific types of data cells 102 and supplemental cells 104.

In some embodiments, storage of the EPLI code word 126, or other system data or other data in further embodiments, in selected supplemental cells 104 as selected by specific reference word lines 112 does not consume the storage space in the data cells 102 array, and does not add area penalty to the NOR flash memory. In various embodiments, supplemental cells 104 are similar or identical to data cells 102, or may be differing sizes or geometries, and both data cells 102 and supplemental cells 104 are a type of NVM cell, more specifically a flash memory cell, and in some embodiments an embedded charge trap cell. In some embodiments, data cells 102 are used for writing data, supplemental cells 104 are used as reference(s), e.g., reference cells, when reading data from data cells 102. In present embodiments, some of the supplemental cells 104 are further used for writing specialized data, including the EPLI code word 126, distinct from the data written to and read from data cells 102. For example, a memory device, a memory controller, etc. could be writing the EPLI code word or other specialized data.

More specifically, in one supplemental embodiment supplemental cells 104 connected to dynamic reference word lines have the EPLI code word 126 written to them, and read back out through comparison with static reference cells 104 connected to static reference word lines, as further described below with reference to FIGS. 3 and 4. The system can then determine status of erasure of data cells 102 in the array, based on reading the EPLI code word 126.

Figure 2:
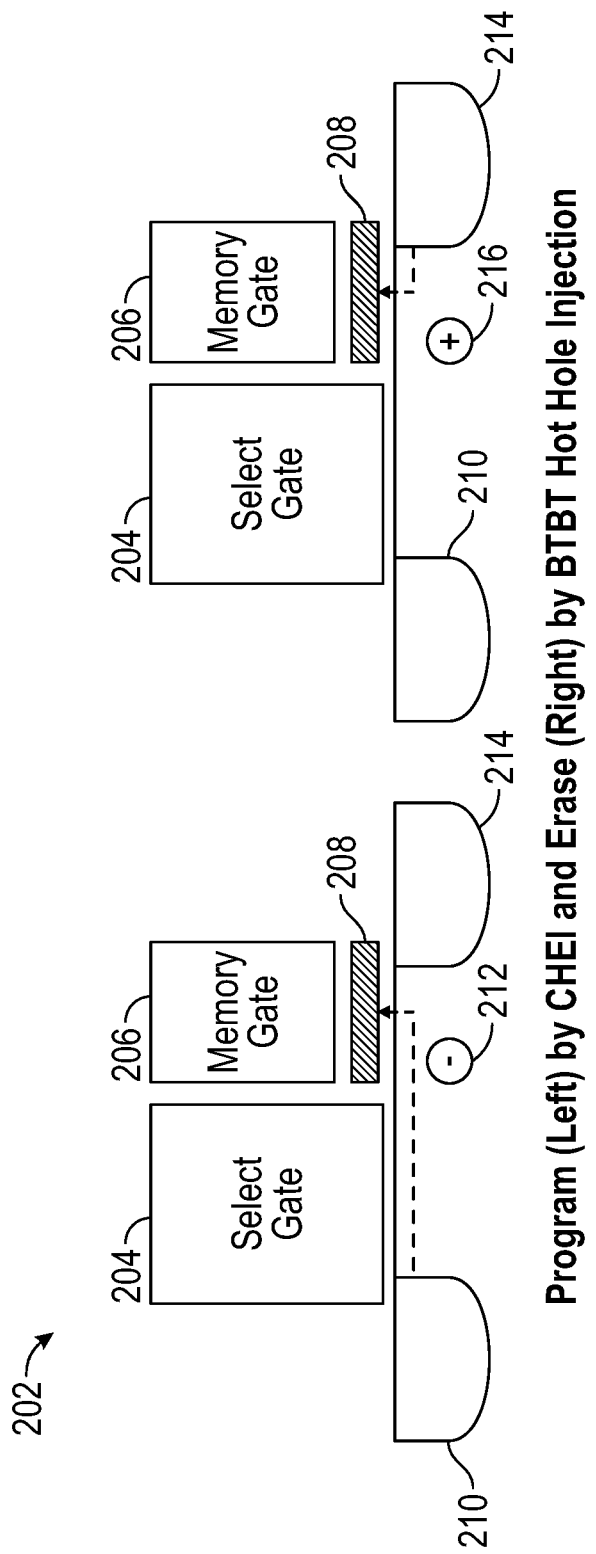
FIG. 2 depicts a specific type of NOR flash memory cell, which has a split gate architecture (1.5 T) and embedded charge trap (eCT™) technology and is suitable for embodiments.

FIG. 2 depicts a specific type of NOR flash memory cell, which has a split gate architecture (1.5 T) or embedded charge trap (eCT™) technology and is suitable for embodiments. In each memory cell, one transistor is a memory gate (MG) 206 that stores non-volatile data, and the other transistor is a select gate (SG) 204. Threshold voltage (Vt) of the memory gate 206 is changed by adding or removing electric charge from the nitride layer 208 of an oxide-nitride-oxide (ONO) gate dielectric. The memory gate 206 is programmed by channel hot electron injection (CHEI), and threshold voltage is increased by injecting negative charges 212 into the nitride layer 208. Erase operation utilizes band-to-band tunneling (BTBT) hot-hole injection, and threshold voltage is decreased by injecting positive charges 216 into the nitride layer 208. In operation in a NOR flash memory array, the select gate 204 and the memory gate 206 of the memory cell are operated by selected word lines (e.g., one word line connected to the memory gate 206 with selectable voltage for programming, reading and erasing, and one word line connected to the select gate 204 for selecting that memory cell). Diffusion regions 210, 214 provide source and drain of the split-gate transistor.

Figure 3:
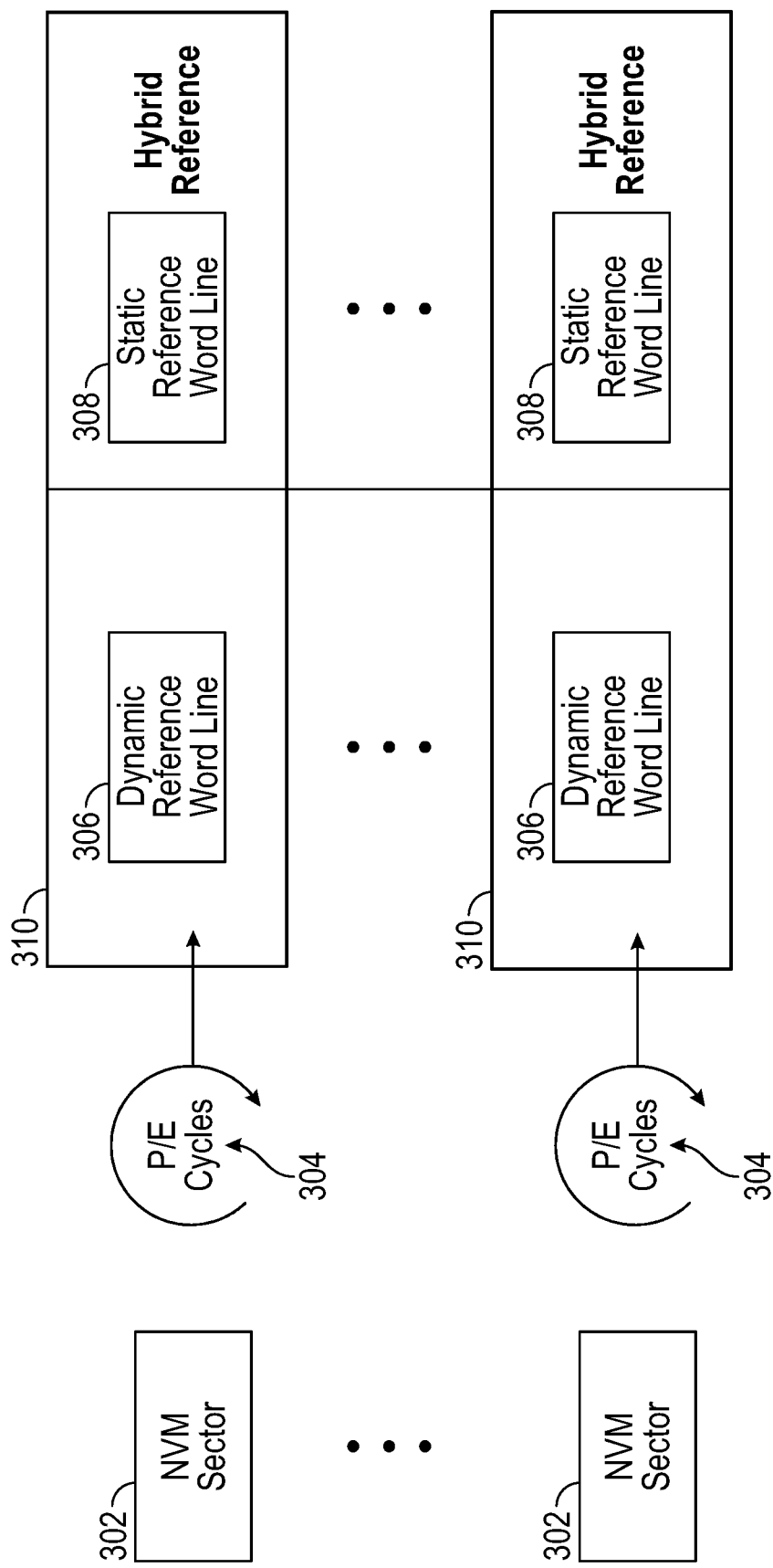
FIG. 3 depicts dynamic reference word lines and static reference word lines, and their relationship to program/erase cycles and a hybrid reference in various embodiments.

FIG. 3 depicts dynamic reference word lines 306 and static reference word lines 308, and their relationship to program/erase cycles 304 and a hybrid reference 310 in various embodiments. With reference back to FIG. 1, in order to read data 124 from a selected data cell 102 in the array, the sense amplifiers 118 compare current (or voltage, in further embodiments) of a selected data cell 102 and current of a selected reference cell 104 or combination of reference cells 104, in various embodiments, across a specified number of bits (e.g., the number of bits in the readout data 120). In the embodiment depicted in FIG. 3, reference cells 104 (see FIG. 1) connected to and controlled by static reference word lines 308 are not or rarely program/erase cycled, or in some embodiments are program/erase cycled less often in comparison to the number of program/erase cycles to which the reference cells 104 connected to and controlled by the dynamic reference word lines 306 are subjected. In turn, so that the aging characteristics of the dynamic reference word lines 306 (i.e., aging characteristics of the reference cells 104 connected to and controlled by dynamic reference word lines 306) track and match the aging characteristics of data cells 102, each dynamic reference word line 306 associated with an NVM sector 302 is subjected to the same number of program/erase cycles 304 for the reference cells 104 of that dynamic reference word line 306 as that corresponding NVM sector 302. The hybrid reference is developed from a combination of a dynamic reference word line 306 and a static reference word line 308, for example producing a current that is midway between the current of a reference cell 104 attached to the dynamic reference word line 306 and the current of a reference cell 104 that is attached to the static reference word line 308. There are multiple ways that a hybrid reference 310 could be produced, for example varying the sizes of the reference cells 104 in comparison to the data cells 102, varying the threshold voltages to which the reference cells 104 are programmed in comparison to the threshold voltages to which the data cells 102 are programmed, combining or averaging currents or voltages of one or more reference cells 104 of a dynamic reference word line 306 and one or more reference cells 104 of a static reference word line 308, or combinations thereof. Dynamic reference word lines, static reference word lines, hybrid reference, and interactions with sense amplifiers are further discussed in U.S. Pat. No. 9,901,001 which is hereby incorporated by reference.

Figure 4:
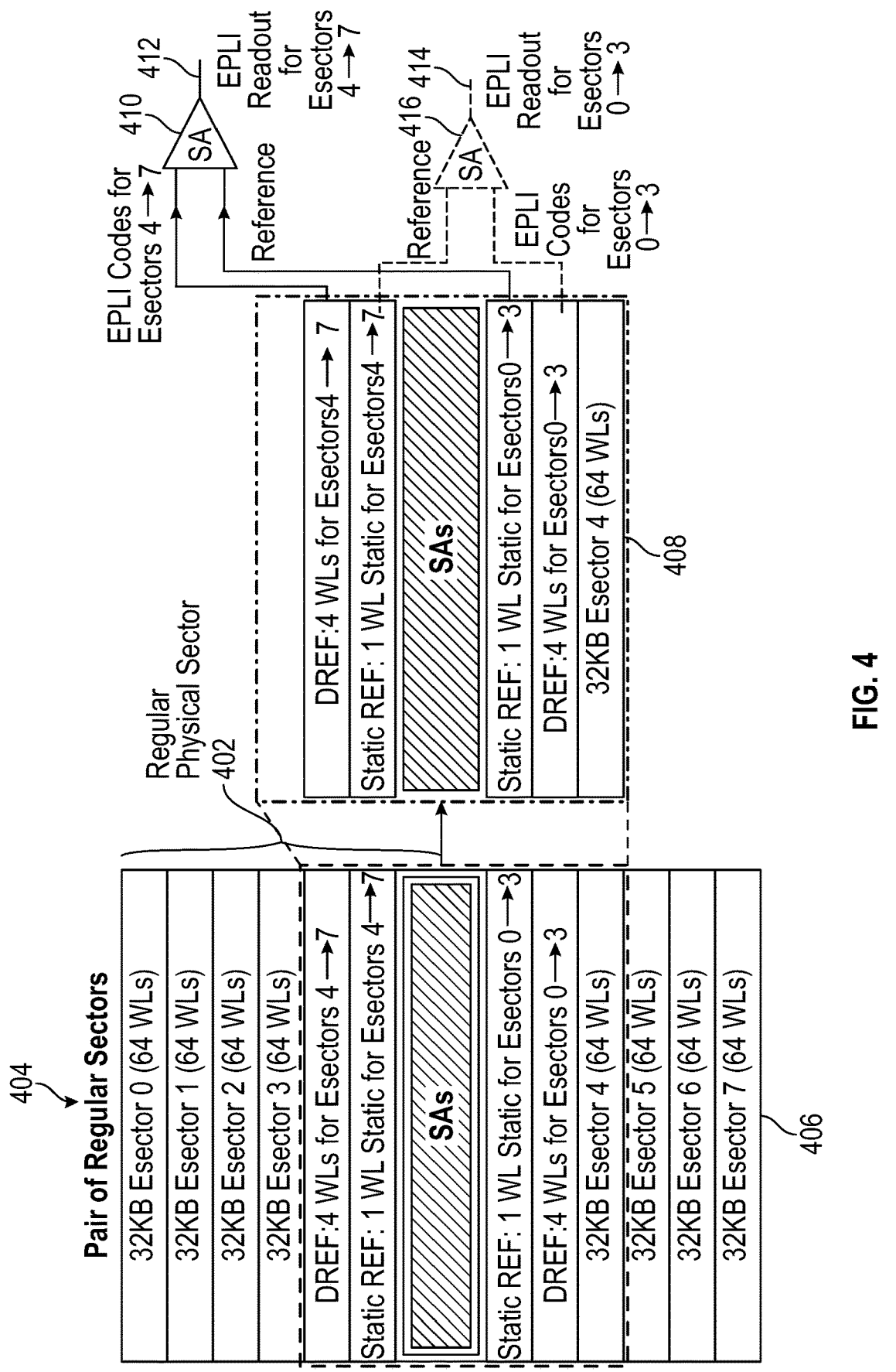
FIG. 4 depicts a pair of regular sectors of a NOR flash memory, with sense amplifiers producing an EPLI readout in accordance with an embodiment.

FIG. 4 depicts a pair 404 of regular sectors 402 of a NOR flash memory 406, with sense amplifiers 410, 416 producing an EPLI readout 412, 414 in accordance with an embodiment. In this example, each regular physical sector 402 includes four erase sectors, also called E-sector 408, and the pair 404 includes two regular sectors 402 sandwiching dynamic reference word lines (DREF WL), static reference word lines (Static REF WL), and sense amplifiers (SAs). The dynamic reference word lines locations contain free cache lines (CLs), and the EPLI code is stored in one of those free CLs multiple times and read using a majority approach (e.g., as further described below with reference to FIGS. 5-7) in various embodiments. The term "cache line" is herein used as meaning a basic memory portion for read/write data. The projected reliability by such majority read significantly exceeds target requirements, even without using hybrid referencing and/or ECC protection (as further described below with reference to FIGS. 8 and 9).

In one embodiment, an EPLI code word is assigned to an E-sector during an erase operation of the E-sector. EPLI codes for each erase operation and for each E-sector may be the same or different in various embodiments. The EPLI code word is later read out to verify if the erase operation is completed, or otherwise not interrupted by power loss. A physical sector pair 404 may contain 8 E-sectors, in one embodiment as an example. E-sectors 0-3 are mirrored to E-sectors 4-7 as shown in the left illustration in FIG. 4. Sensing of data located above or on one side of SAs is done vs. or comparing to hybrid reference scheme (see FIG. 3) located below or the other side of SAs (and vice versa). This is implemented through sense amplifier 410 comparing EPLI codes for E-sectors 4-7 as written to supplemental cells (or unused reference cells) 104 of dynamic reference word lines for E-sectors 4-7, and referenced to static reference cells 104 from static reference word lines for E-sectors 0-3, and sense amplifier 416 comparing EPLI codes for E-sectors 0-3 as written to supplemental cells 104 of dynamic reference word lines for E-sectors 0-3, and referenced to reference cells 104 from static reference word lines for E-sectors 4-7. There is an EPLI code per E-sector, located in the DREF WL of the E-sector and sensed with respect to the static reference of the mirrored sector. In embodiments, EPLI code for each E-sector may be the same or different. It will be the understanding that, in other embodiments, a sector such as regular sectors 402 and 406, may include any number of E-sectors without deviating from the teaching of this disclosure.

Now, because the reading out of the EPLI code word 126 from the supplemental cells 104 of the dynamic word reference lines uses comparison only to the reference cells 104 of the static reference word lines, this readout does not have the read reliability benefit from the use of the hybrid reference 310 (see FIG. 3) as would the readout of the data 124 from the data cells 102 in the NVM data cell 102 array. There is thus a problem to be solved, to improve read reliability of such data written to a dynamic reference word line (e.g., to supplemental cells 104 of a dynamic reference word line 306). Various solutions to this technological problem are given below.

Figure 5:
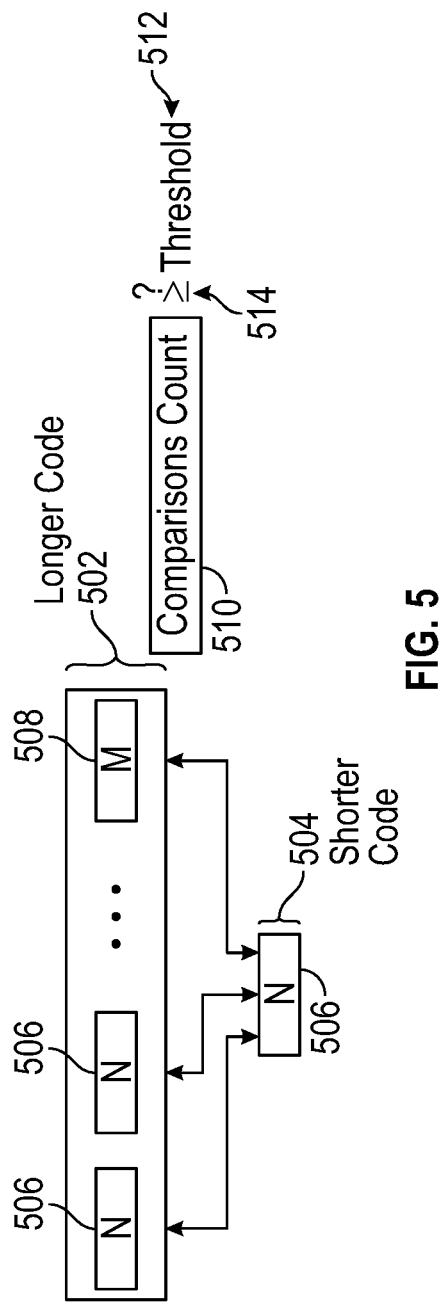
FIG. 5 depicts one embodiment for verification of a longer code composed of multiple repetitions of a shorter code, which is suitable for verification of an EPLI code word.

FIG. 5 depicts one embodiment for verification of a longer code 502 composed of multiple repetitions of a shorter code 504, which is suitable for verification of an EPLI code word 126 (see FIG. 1). Here, the longer code 502 is built up of a specified number of repetitions of the shorter code 504, which is, for example, an EPLI code 506 "N". In further embodiments, the shorter code 504 could be system data or other specialized data. The longer code 502 is written to the dynamic reference word line 306 (i.e., written to supplemental cells 104 of the dynamic reference word line 306) during an erase operation, and later read out from the same dynamic reference word line 306, at which time the readout of the longer code 502 may be perfect or may have corruption or error. To validate (or not), i.e., to check the readout of the longer code 502, each repetition of the shorter code 504 is compared to a predetermined value of the shorter code 504. For example, to validate a readout of the EPLI code word 126, each repetition of the EPLI code 506 in the readout data 120 is compared to the predetermined value, e.g., the original, correct value of the EPLI code 506 "N". A comparisons count 510 of the number of correct matches for the shorter code 504 within the readout of the longer code 502 is compared 514 to a threshold 512, e.g., a minimum count number. For example, in FIG. 5, the comparisons count 510 would total two or more, since two instances of the EPLI code 506 value "N" are shown in the readout of the longer code 502, and one instance of a different, error 508 value "M" is shown in the readout of the longer code 502. If the comparisons count 510 meets the threshold 512, the readout of the EPLI code word 126 is verified or validated as having the correct EPLI code 506. In turn, this verification indicates the corresponding sector of the NVM memory is trusted as having completed an erasure process without power loss disruption or other disruption (because only then, upon such completion, would the EPLI code 506 and longer code 502 or EPLI code word 126 have been written to the dynamic reference word line 306 corresponding to that NVM sector 302).

Figure 6:
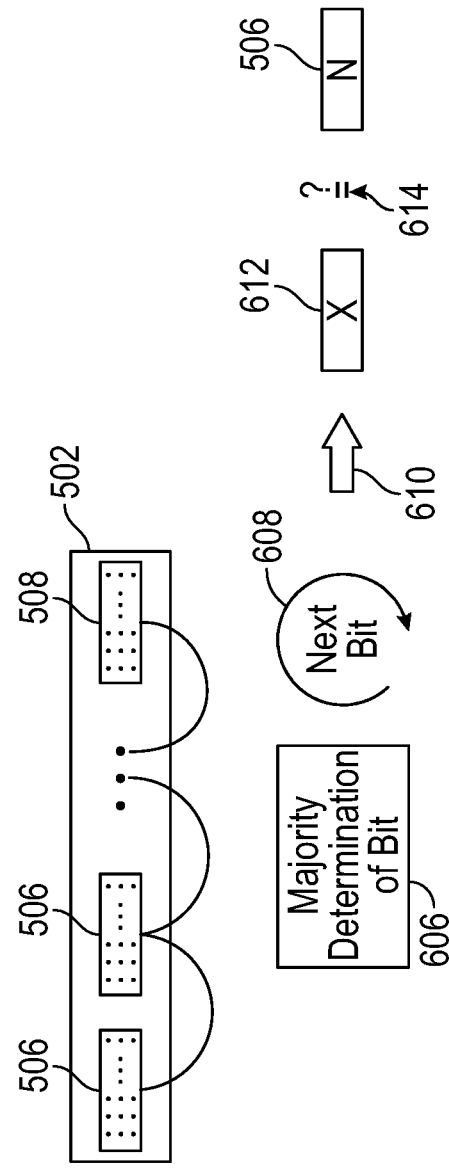
FIG. 6 depicts a further embodiment for verification of a longer code composed of multiple repetitions of a shorter code, which is suitable for verification of an EPLI code word.

FIG. 6 depicts a further embodiment for verification of a longer code 502 composed of multiple repetitions of a shorter code 504, which is suitable for verification of an EPLI code word 126. Similar to the depiction in FIG. 5, the longer code 502 is built up, written to available supplemental non-volatile memory cells in the dynamic reference word line 306, and later read out to be verified or checked. To validate (or not), i.e., to check the EPLI code word 126, a specific bit of each repetition of the shorter code 504, i.e., one bit of each presumed repetition of the EPLI code 506, is subjected to a majority determination of bit 606, followed by a majority determination of the next bit 608, etc., proceeding across all of the bits (in serial or in parallel in various embodiments) of the repetitions of the shorter code 504 in the longer code 502. From the majority determination for each bit, the readout value 612 for the shorter code 504 is determined, in this example value "X", and this is subjected to comparison 614 with the predetermined value of the shorter code 504, in this example the EPLI code 506 value "N". In this example, the two are found not equal, and validation fails, indicating the corresponding sector of NVM memory is not to be trusted as having completed an erasure process without power loss disruption.

Figure 7:
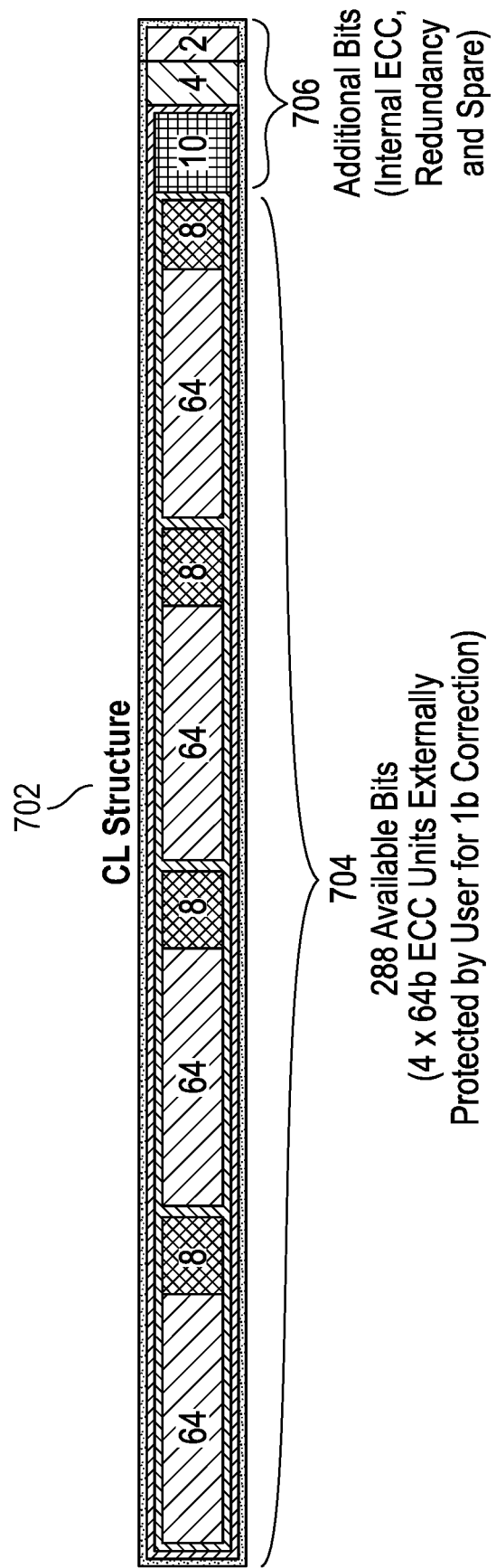
FIG. 7 depicts a cache line (CL) structure that has a specified number of available bits and is suitable for writing and reading an EPLI code word in various embodiments.

FIG. 7 depicts a CL structure 702 that has a specified number of available bits 704 or supplemental cells or unused reference cells (e.g., 288 available bits in one of the CLs in a dynamic reference wordline) and is suitable for writing and reading an EPLI code word 126 in various embodiments. In one embodiment, CL structure 702 may be a portion of supplemental NVM cells or unused reference cells of a dynamic reference word line that are available for storing system data, such as EPLI code. The CL structure 702 also has additional bits 706, e.g., 16 additional bits as ten bits internal error correction code (ECC), four bits redundancy and two bits spare. Normally, for writing data to data cells 102 in the array, the CL structure 702 would be used for 4Δ64 b ECC units that are externally protected by the user for one bit correction. In one embodiment, for writing an EPLI code word 126, the CL structure provides a total of 288 bits (=4×(64+8)) that do not have to be used as four groups of 64-bit data each with eight bits for ECC, but instead are available for other forms of code. Next, various considerations for how to optimize another form of code are considered. It will be the understanding that the 288 available bits 704 depicted above is an example and numbers of available bits in CL structure 702 may vary in different embodiments.

Figure 8:
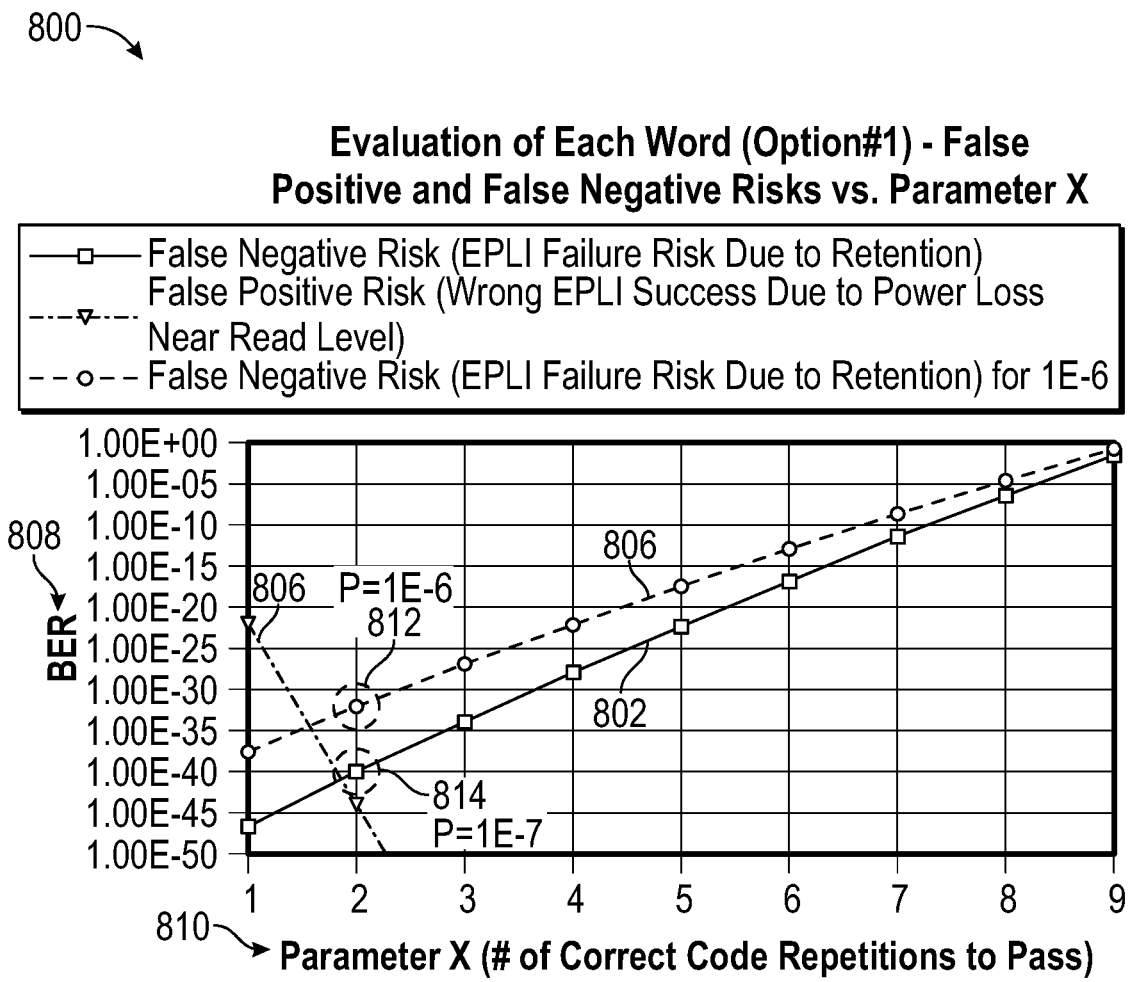
FIG. 8 is a graph for evaluation of option #1 in consideration of the number of correct code repetitions to pass verification of a longer code word composed of multiple repetitions of a shorter code, for example as depicted with the EPLI code word in FIG. 5.

FIG. 8 is a graph 800 for evaluation of option #1 in consideration of the number of correct code repetitions to pass verification of a longer code word composed of multiple repetitions of a shorter code, for example as depicted with the EPLI code word in FIG. 5. Here, the consideration is how many correct code repetitions, i.e. error-free repetitions of the shorter code 504 in the readout of the longer code 502 would optimally balance between the risk of false positive and false negative. Bit error rate (BER) 808 is on the vertical axis, and parameter X 810 (# of correct code repetitions to pass) is on the horizontal axis of the graph 800. The graph shows evaluation of each word (option #1) false positive and false negative risks versus parameter X, depicting False negative risk 802 (EPLI failure risk due to retention), false positive risk 804 (wrong EPLI success due to power loss near read level), and false negative risk 806 (EPLI failure risk due to retention) for single bit error probability of 1E-6. In this particular example, intersection of the curves indicates an optimal value of "2" for Parameter X at two different single bit error probability points 812, 814. From this evaluation, it is determined that the minimum number of correct code repetitions is two, for such verification. Other numbers of correct code repetitions are possible in various embodiments.

One suitable analysis is as follows. A memory controller or memory device may out the EPLI code word and evaluate each of nine versions or repetitions of the 32 bit EPLI code in the EPLI code word that is read out. The memory controller or memory device may check each of the 9 32-bit word readouts to see if they match the predetermined EPLI code. If x (or >x) of the 9 versions or repetitions of the 32 bit EPLI code are correct, then the EPLI passes verification (e.g., 32 bits matching 8 times and one mismatch is ok). The value of "x", for a threshold of how many repetitions of the 32 bit EPLI code in the EPLI code word readout should match the predetermined EPLI code, may be determined in various ways, for example through empirical testing or theoretical optimizing, or factory, user or administrator setting.

A memory controller or memory device may perform a majority determination of each bit-place of the 32 bit EPLI code as repeated in the EPLI code word. The memory controller may check each of the 32 bits across each of the nine repetitions in the EPLI code word readout, and determine a 0 or 1 for the bit based on a majority (i.e., no possibility of a tie, since 9 is an odd number). Then, if the EPLI code, with each bit majority determined matches the predetermined EPLI code, the EPLI passes verification. Considering optimization for a memory controller or memory device that may perform a majority type 1 determination (1st majority embodiment), the graph 800 shows EPLI code false negative and false positive probabilities (on the vertical axis) vs. parameter x according to majority type 1 (on the horizontal axis). The parameter x is the number of correct code repetitions to pass verification, using the majority type 1 determination as described above with reference to FIG. 5.

One optimal result is achieved for x=2 repetitions (i.e. the EPLI test passes if at least 2 out of the 9 code repetitions match the predetermined EPLI code). The test error probability is ~1E-40 assuming single bit failure probability of 1E-7 (eCT40 WC assessment for read with respect to static references).

Figure 9:
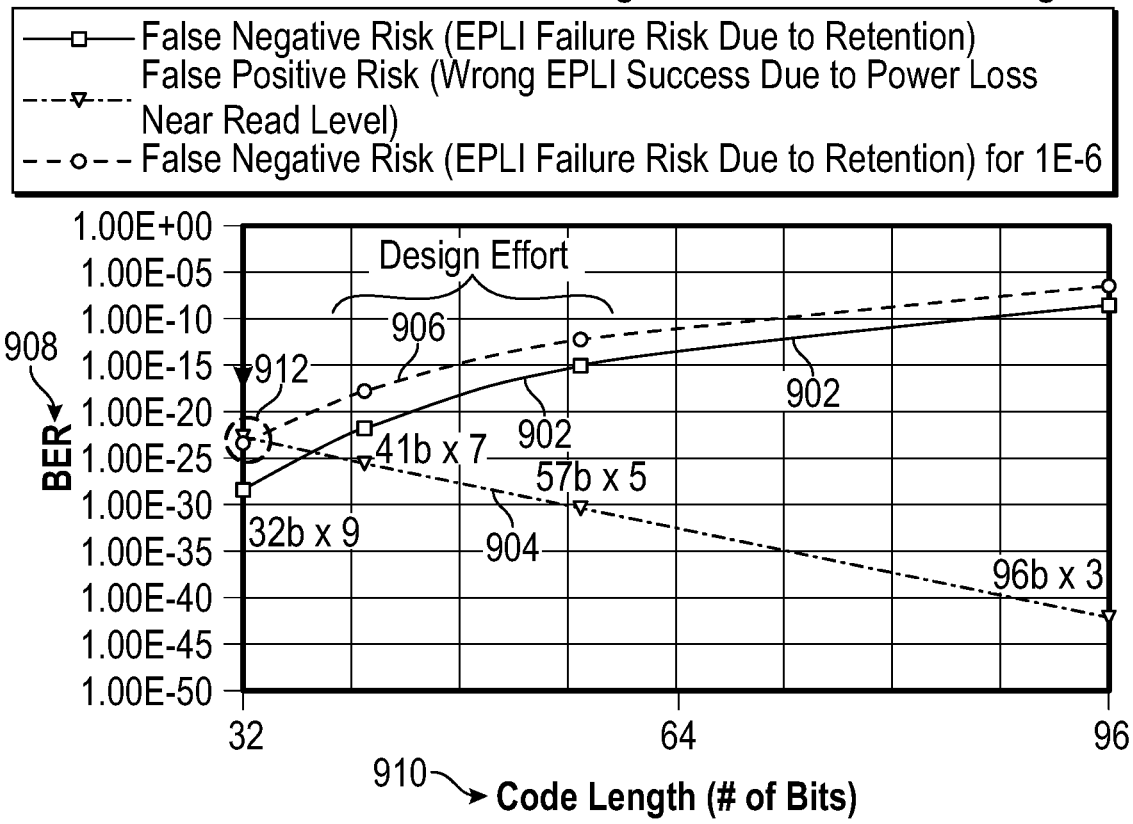
FIG. 9 is a graph for evaluation of option #2 in consideration of code length (number of bits) for verification of a longer code word composed of multiple repetitions of a shorter code, for example as depicted with the EPLI code word in FIG. 6.

FIG. 9 is a graph 900 for evaluation of option #2 in consideration of code length (number of bits) for verification of a longer code word composed of multiple repetitions of a shorter code, for example as depicted with the EPLI code word in FIG. 6. Here the consideration is what code length would optimally balance between the risk of false positive and false negative, i.e. how many bits should be in the shorter code 504. Bit error rate (BER) 908 is on the vertical axis, and parameter code length 910 (# of bits) is on the horizontal axis of the graph. The graph 900 shows evaluation of false negative risk 902 (EPLI failure risk due to retention), false positive risk 904 (wrong EPLI success due to power loss near read level), and false negative risk 906 (EPLI failure risk due to retention) for single bit error probability of 1E-6. Intersection of the curves indicates an optimal value of 32 bits code length at one probability point 912. From this evaluation of this particular example, it is determined that the optimal number of bits for the shorter code 504, e.g., EPLI code 506, is 32 bits. Other numbers of bits in the shorter code 504 or EPLI code 506 are possible in various embodiments.

One suitable analysis is as follows. Considering optimization for a memory controller or memory device that may perform a majority type 2 determination (2nd majority embodiment), the graph 900 shows EPLI code false negative and false positive probabilities (on the vertical axis) vs. several options of code length and corresponding odd code repetitions in a 288 bits size CL (see FIG. 7), according to majority type 2 (on the horizontal axis).

With reference to FIGS. 5, 6, 7, 8 and 9, in one embodiment: One optimal result, at probability point 912, is achieved for EPLI code length of 32 bits and 9 repetitions, which fits a 288 bits size CL. The test error probability is ~1E-23 assuming a single bit failure probability of 1E-7. The test error probability remains ~1E-23 for a single bit error probability up to 1E-6.

Additional notes and conclusions: Although majority approach 1 is better in reliability, both majorities provide EPLI reliability that is significantly above target. A significant advantage of majority approach 2 is that it always provides a readout regardless of the value of a predetermined code, therefore, this implementation approach is also a better fit to additional applications such as a counter. Therefore, one embodiment uses the majority approach 2 (i.e., majority determination per bit).

In various embodiments, system data other than EPLI codes may be stored, read, and verified with similar algorithms and methods as depicted in FIGS. 4 to 9. In other embodiments, the storing, reading, and verifying of system data may or may not related to an erase operation.

Figure 10:
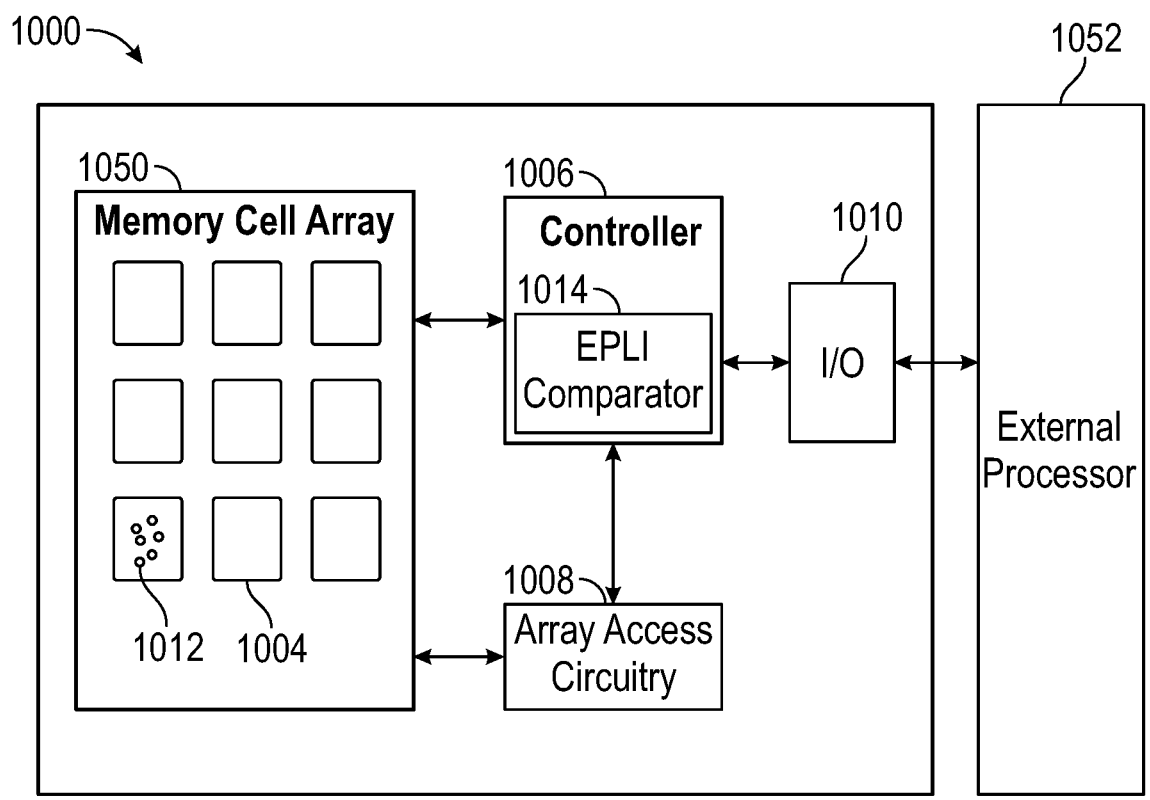
FIG. 10 depicts an embodiment of a NOR flash memory device that is suitable for using various embodiments of NOR flash memory as described herein and variations thereof.

FIG. 10 depicts an embodiment of a system 1000 that is suitable for using embodiments of the non-volatile memory described herein. The system 1000 can be implemented as one or multiple integrated circuits, for example. An external processor 1052 connects through I/O 1010 to the controller 1006, in the system 1000. Internal to the system 1000, a memory cell array 1050 has multiple erase sectors 1004. Erase sectors 1004 have EPLI bits 1012. In one embodiment, memory cell array 1050 may adopt the architecture and be arranged similarly to NOR flash memory 406, as depicted in FIG. 4 and its corresponding description. A controller 1006 connects to the memory cell array 1050 directly and also through array access circuitry 1008, and has an EPLI comparator 1014. In one embodiment, EPLI comparator 1014 may be tasked to compare the EPLI code words programmed in particular E-sectors during erase operations to the pre-determined or pre-stored EPLI codes to verify the completion of the erase operations. In one embodiment, the pre-determined or pre-stored EPLI codes may be generated or stored within controller 1006.

Figure 11A:
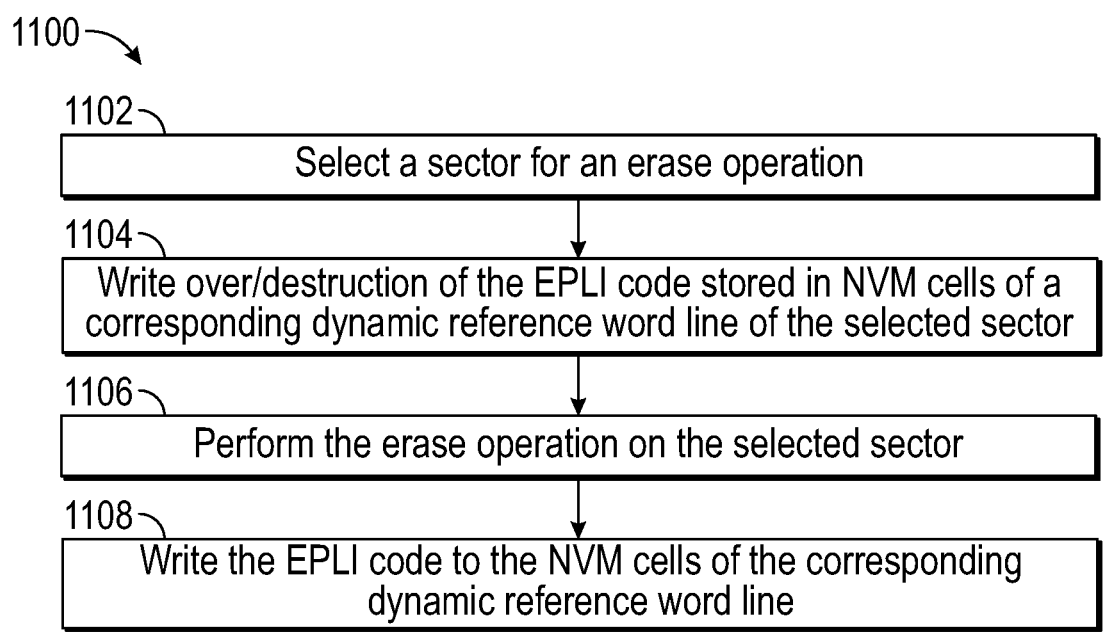
FIG. 11A is a flow diagram for a method of operating an EPLI erase operation in a NOR flash memory in accordance with an embodiment.
Figure 11B:
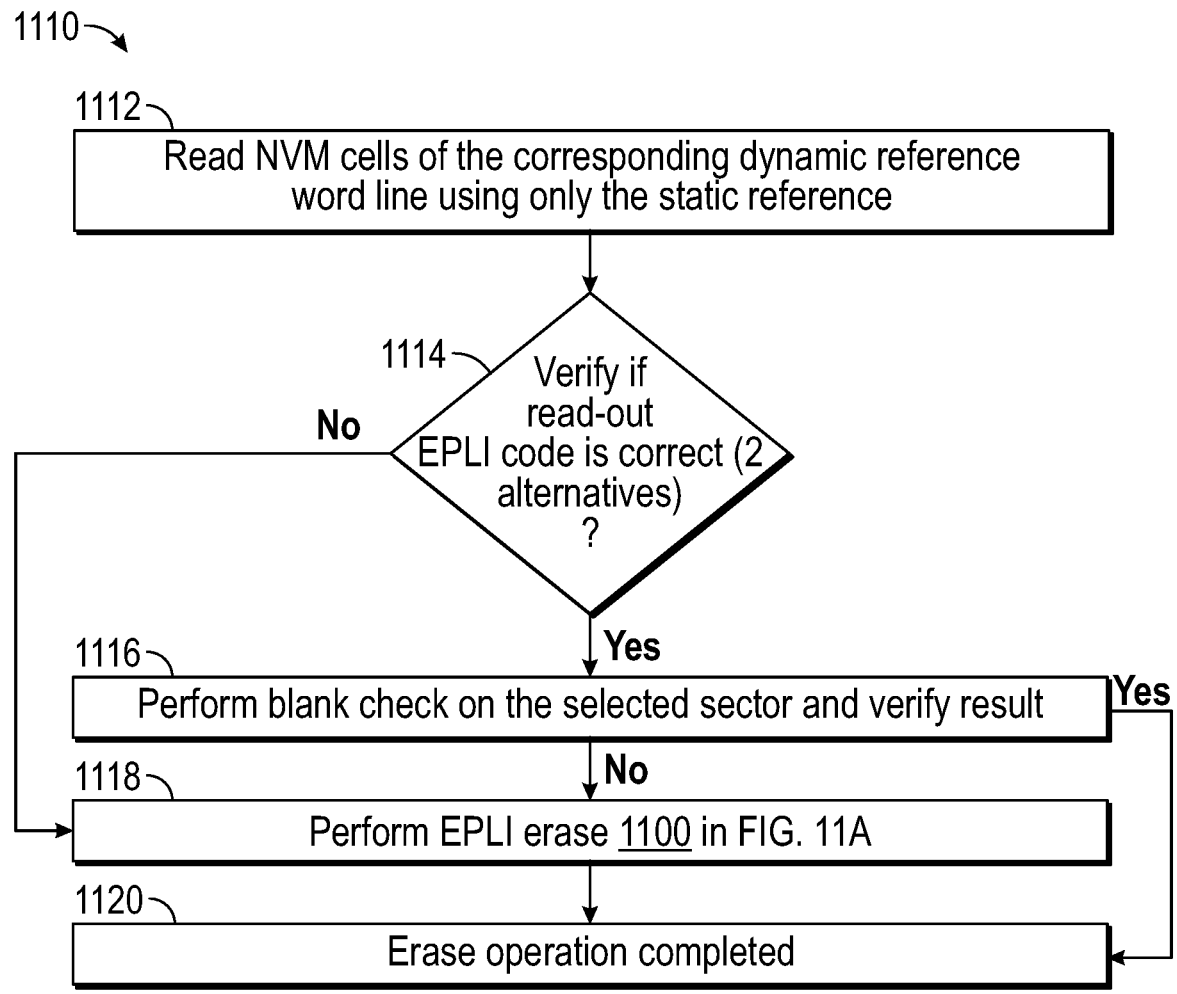
FIG. 11B is a flow diagram of a method of operating a blank check operation in a NOR flash memory in accordance with an embodiment.

FIGS. 11A and 11B are flow diagrams for a method of operating a NOR flash memory in accordance with an embodiment. The method can be practiced using or by present embodiments and variations thereof, referred to as a system performing actions, in functional description. In some embodiments, the method can be practiced by hardware (e.g., digital and analog circuitry), firmware, software executing on a processor, and combinations thereof, or can be embodied in non-transient, tangible, computer-readable media. The method is suitable for practice using a NOR flash memory that has dynamic reference word lines and static reference word lines, including eCT™ memory and devices having eCT™ memory.

In one embodiment, the system writes data to the NOR flash memory array. For example, the system writes data to selected data cells, e.g. data cells 102 in FIG. 1 of the NOR flash memory array, also called non-volatile memory cells of the array.

In one embodiment, the system reads data from the NOR flash memory array, using sense amplifiers and hybrid reference of dynamic reference word lines and static reference word lines, as depicted in FIG. 3 and its corresponding description. Various mechanisms for a hybrid reference, based on reference cells connected to and controlled by selectable dynamic reference word lines and selectable static reference word lines are described herein as suitable for performing the action 1104.

Reference is now made to FIG. 11A which is an exemplary flow chart of an EPLI erasure operation 1100 used in non-volatile memory, such as memory cell array 1050 in FIG. 10, according to an embodiment of the present disclosure. In an action 1102, a sector, such as sector 406 in FIG. 4, is selected for an erase operation.

In an action 1104, the EPLI code that is already stored in supplemental NVM cells of a corresponding dynamic reference word line is written over or destroyed. In one embodiment, all supplemental NVM cells that store the EPLI code are written to a programmed state (for example "0"). Action 1104 is necessary because a power-loss may occur while erasing the selected sector in action 1106, leaving a correct EPLI code (from a previous erase operation) with an untrusted sector (erase interrupted). Therefore, EPLI code destruction must occur just before erasing the sector.

In an action 1106 the system erases the selected sector of the NOR flash memory array. The erasure process is specific to the type of NVM memory cell in the NOR flash memory array, and may also be system and implementation specific. In one embodiment, the erasure process may also include one of or a combination of pre-program of all bits in the selected sector, erase operation, soft-program to correct over-erased bits, and non-data program.

In an action 1108, the system writes an erasure power loss indicator (EPLI) to the supplemental NVM cells of the corresponding dynamic reference word line. For example, each sector of the NOR flash memory array has a corresponding dynamic reference word line which is used in reading data of that sector and now also used for storing an EPLI, for example in the form of an EPLI code word. In one embodiment, the EPLI code word may be stored in the available CL structure 702 in FIG. 7, and the EPLI code word may be stored in duplicates as described in FIGS. 5, 6 and their corresponding description. In one embodiment, after the EPLI code word is programmed into the supplemental NVM cells of the corresponding dynamic reference word line, the EPLI erase operation 1100 may be considered completed. In one embodiment, if the EPLI erase operation 1100 is interrupted due to power loss, the EPLI code word will not be written and all EPLI bits may remain "programmed 1" as a consequence of the action 1104.

Reference is now made to FIG. 11B which is an exemplary flow chart of an erase operation 1110 incorporating a blank check used in non-volatile memory, such as memory cell array 1050 in FIG. 10, according to an embodiment of the present disclosure.

Responding to an erase command of a particular sector, in an action 1112, the system reads the value of the erasure power loss indicator from supplemental NVM cells of a corresponding dynamic reference word line using sense amplifiers and static reference NVM cells of a static reference word line. For example, sense amplifiers comparing currents of selected supplemental NVM cells connected to the corresponding dynamic reference word line and selected static reference NVM cells connected to the static reference word line, to determine readout data from what is written on the selected supplemental NVM cells of the dynamic reference word line. In one embodiment, the read/sense operation in the action 1112 may be similar to the embodiments depicted in FIG. 4 and its corresponding description.

In an action 1114, the system verifies the value of the erasure power loss indicator, as read out in the action 1112 by comparing it to the pre-stored or pre-determined EPLI code. Multiple mechanisms for verification of the erasure power loss indicator code word, and the EPLI code, are described above in FIGS. 5, 6, 7, 8, and 9, and one may be employed and even optimized for this function. If the read-out EPLI code is verified as correct (YES), the sector may be considered trusted signifying the last erase operation was not interrupted, and it will proceed to the next action 1116. However, if the read-out EPLI code is verified as incorrect (NO), the sector is not trusted and the process flow will cycle back to an action 1118, in which the EPLI erase operation 1100 as described in FIG. 11A will be performed.

In an action 1116, the system performs a blank check of the selected sector of the NOR flash memory array. Blank checking is frequently used in non-volatile memory devices to determine if a sector is erased. For example, during a blank check all the bits in the sector may be read and if all are set to an erased state or "1", the sector may be considered erased. Blank checking may be particularly useful as it may save "re-erasing" a sector which has already been erased, allowing a "blank checked" sector to be skipped over during an erasure process and thus saving time. Additionally, it may save performing an additional erase cycle which may contribute to an increase in the reliability of the memory device. Because the EPLI is verified in the action 1114, this indicates the NVM sector that corresponds to the specific dynamic reference word line is trusted to have not had a power loss during the last erase process, results of the blank check should be reliable. Alternatively, if the value that is read out for the EPLI fails to verify in the action 1112, the system could perform remedial actions, for example an erasure process followed by writing the EPLI code. Then, the system validates results of the blank check. If the results are validated, it may proceed to an action 1120 in which the erase is considered completed. If the blank check results are not validated, the process flow will cycle back to the action 1118 in which the EPLI erase operation 1100 as described in FIG. 11A will be performed.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "writing," "reading," "erasing," "determining," "verifying," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the embodiments should, therefore, be determined with reference to the appended claims, along with the full scope of equivalents to which such claims are entitled.

What is claimed is:

1. A non-volatile memory, comprising:
    an array of non-volatile memory cells arranged in rows to be selected by word lines and columns to be selected, for writing and reading;
    a plurality of reference word lines comprising first reference word lines and second reference word lines, each to select corresponding supplemental non-volatile memory cells from the first reference word line and reference non-volatile cells from the second reference word line;
    a plurality of sense amplifiers arranged to:
        read, using a comparison of the supplemental non-volatile memory cells of the first reference word lines to the reference non-volatile memory cells of the second reference word lines, system data that has been written to the supplemental non-volatile memory cells of the first reference word lines after an erase operation; and
    a processing element to determine a status of the erase operation of the non-volatile memory, based on reading the system data that has been written to the supplemental non-volatile memory cells of the first reference word lines.

2. The non-volatile memory of claim 1, wherein:
    the non-volatile memory cells of the array and the supplemental non-volatile memory cells of the plurality of reference word lines each comprise split-gate memory cells;
    the first reference word lines comprise dynamic reference word lines;
    the second reference word lines comprise static reference word lines; and
    the system data comprises erase power loss indicator (EPLI) code.

3. The non-volatile memory of claim 1, wherein:
    the system data includes at least one of erase power loss indicator (EPLI) code, cycling counter, codes, counters, pointers to addresses, calculation results, information about chip performance, and information about chip reliability.

4. The non-volatile memory of claim 1, wherein:
    the system data comprises a longer code comprising repeated instances of a shorter code; and
    the shorter code comprises an erase power loss indicator (EPLI) code.

5. The non-volatile memory of claim 1, wherein:
    the system data that has been written to the supplemental non-volatile memory cells of a selected first reference word line is to be verified through a check of each of a plurality of repetitions of a shorter code in a longer code readout in comparison to a predetermined value of the shorter code.

6. The non-volatile memory of claim 1, wherein:
    the system data that has been written to the supplemental non-volatile memory cells of a selected first reference word line is to be verified through a majority determination of each bit of a shorter code across a plurality of repetitions of the shorter code in a longer code readout, in comparison to a predetermined value of the shorter code.

7. A method of operating a NOR flash memory, comprising:
    writing system data to selected supplemental cells of first reference word lines;
    reading the system data, through sense amplifiers comparing the selected supplemental cells of the first reference word lines and selected reference cells of second reference word lines; and determining a status of an erasure state of a non-volatile memory, based on the reading the system data that has been written to the selected supplemental cells of the first reference word lines.

8. The method of claim 7, wherein:
the non-volatile memory cells of the array and the non-volatile memory cells of the plurality of reference word lines each comprise split-gate memory cells;
the first reference word lines comprise dynamic reference word lines;
the second reference word lines comprise static reference word lines; and
the system data comprises erase power loss indicator (EPLI) code.

9. The method of claim 7, wherein:
the system data includes at least one of erase power loss indicator (EPLI) code, cycling counter, codes, counters, pointers to addresses, calculation results, information about chip performance, and information about chip reliability.

10. The method of claim 7, wherein the writing the second data comprises writing a longer code comprising repeated instances of a shorter code comprising an erase power loss indicator (EPLI) code.

11. The method of claim 7, further comprising:
verifying the second data that has been read, by checking each of a plurality of repetitions of a shorter code in a longer code that the second data as written comprises, in comparison of each of a plurality of corresponding portions of the second data that has been read to a predetermined value of the shorter code.

12. The method of claim 7, further comprising:
verifying the second data that has been read, by comparing a predetermined value of a shorter code and a majority determination of each bit of the shorter code across a plurality of repetitions of the shorter code in a longer code that the second data comprises.

13. The method of claim 7, wherein:
the second data comprises a longer code having nine repetitions of a shorter code comprising a 32 bits erase power loss indicator (EPLI) code; and
a verification of the second data that has been read, in comparison to a predetermined value of the EPLI code, indicates a corresponding sector of the NOR flash memory is trusted as not having had a power loss during erasure, and the corresponding sector is ready for a blank check.

14. A system, comprising:
an array of non-volatile memory cells arranged in rows to be selected by word lines and columns to be selected, for writing and reading as a NOR flash memory;
a plurality of reference word lines comprising first reference word lines and second reference word lines, each to select corresponding supplemental non-volatile memory cells;
a plurality of sense amplifiers selectably coupled to the supplemental non-volatile memory cells of the plurality of reference word lines, and, via bit lines, to the non-volatile memory cells of the array; and a controller, to:
write system data to selected supplemental non-volatile memory cells of the first reference word lines;
read the system data, through the sense amplifiers comparing the selected supplemental non-volatile memory cells of the first reference word lines and selected reference non-volatile memory cells of the second reference word lines; and
determine a status of erasure of the non-volatile memory cells of the array, based on such reading the system data.

15. The system of claim 14, wherein:
the non-volatile memory cells of the array and the supplemental non-volatile memory cells of the plurality of reference word lines each comprise split-gate memory cells;
the first reference word lines comprise dynamic reference word lines;
the second reference word lines comprise static reference word lines; and
the system data comprises erase power loss indicator (EPLI) code.

16. The system of claim 14, wherein:
the system data includes at least one of erase power loss indicator (EPLI) code, cycling counter, codes, counters, pointers to addresses, calculation results, information about chip performance, and information about chip reliability.

17. The system of claim 14, wherein the second data comprises a longer code comprising repeated instances of a shorter code comprising an erase power loss indicator (EPLI) code.

18. The system of claim 14, further comprising the controller to:
verify the second data that has been read, by checking each of a plurality of repetitions of a shorter code in a longer code that the second data as written comprises, in comparison of each of a plurality of corresponding portions of the second data that has been read to a predetermined value of the shorter code.

19. The system of claim 14, further comprising the controller to:
verify the second data that has been read, by comparing a predetermined value of a shorter code and a majority determination of each bit of the shorter code across a plurality of repetitions of the shorter code in a longer code that the second data comprises.

20. The system of claim 14, wherein:
the second data comprises a longer code having nine repetitions of a shorter code comprising a 32 bits erase power loss indicator (EPLI) code;
the controller is further to perform a verification of the second data that has been read, in comparison to a predetermined value of the EPLI code, to indicate a corresponding sector of the NOR flash memory is trusted as not having had a power loss during erasure; and
the controller is further to perform a blank check of the corresponding sector of the NOR flash memory, responsive to the verification of the second data that has been read.

* * * * *